(12) United States Patent
Inaba (10) Patent No.: US 6,608,850 B1
(45) Date of Patent: Aug. 19, 2003

(54) SEMICONDUCTOR LASER APPARATUS

(75) Inventor: Yuichi Inaba, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/511,436

(22) Filed: Feb. 23, 2000

(30) Foreign Application Priority Data

Feb. 23, 1999 (JP) .............................. 11-044398

(51) Int. Cl.$^7$ ................................................. H01S 5/00
(52) U.S. Cl. ............................. 372/45; 372/43; 372/46; 372/50
(58) Field of Search .............................. 372/43, 45, 46, 372/50

(56) References Cited

U.S. PATENT DOCUMENTS

| | | | | |
|---|---|---|---|---|
| 4,984,244 A | * | 1/1991 | Yamamoto et al. ............ | 372/45 |
| 5,029,175 A | * | 7/1991 | Ohnaka et al. ................ | 372/45 |
| 5,065,404 A | * | 11/1991 | Okajima et al. ............... | 372/45 |
| 5,398,255 A | | 3/1995 | Terakado | |
| 5,692,002 A | * | 11/1997 | Mitzutani ..................... | 372/46 |
| 5,764,670 A | * | 6/1998 | Ouchi .......................... | 372/45 |
| 5,923,690 A | * | 7/1999 | Kume et al. ................... | 257/94 |
| 6,323,507 B1 | * | 11/2001 | Yokoyama et al. ........... | 257/79 |

OTHER PUBLICATIONS

Y. Inaba, et al., High–Temperature Operation of 1.3μm Tapered–Active–Stripe Laser for Direct Coupling To Single–Mode Fiber, IEEE Journal of Selected Topics in Quantum Electronics, 9 pages, vol. 3, No. 6, Dec. 1997.

* cited by examiner

*Primary Examiner*—Paul Ip
*Assistant Examiner*—Delma R. Flores Ruiz
(74) *Attorney, Agent, or Firm*—RatnerPrestia (57) ABSTRACT

According to one aspect of the present invention, there is provided a semiconductor laser device, including: a semiconductor substrate of a first conductivity type; an active layer having a stripe structure formed on the semiconductor substrate; a first buried layer of a second conductivity type formed on the semiconductor substrate and in a vicinity of the active layer; a second buried layer of the first conductivity type formed on the first buried layer and in the vicinity of the active layer; and a third buried layer of the second conductivity type formed on the second buried layer and in the vicinity of the active layer. In this semiconductor laser device, a difference between a refractive index of the first buried layer and a refractive index of the second buried layer is about 0.02 or less, and a difference between the refractive index of the second buried layer and a refractive index of the third buried layer is about 0.02 or less.

7 Claims, 6 Drawing Sheets

SEMICONDUCTOR LASER APPARATUS

BACKGROUND OF THE INVENTION

1. Field of the Invention

The present invention relates to a semiconductor laser device.

2. Description of the Related Art

A conventional semiconductor laser device will be described with reference to FIGS. 6A through 6C.

Figure 6A:
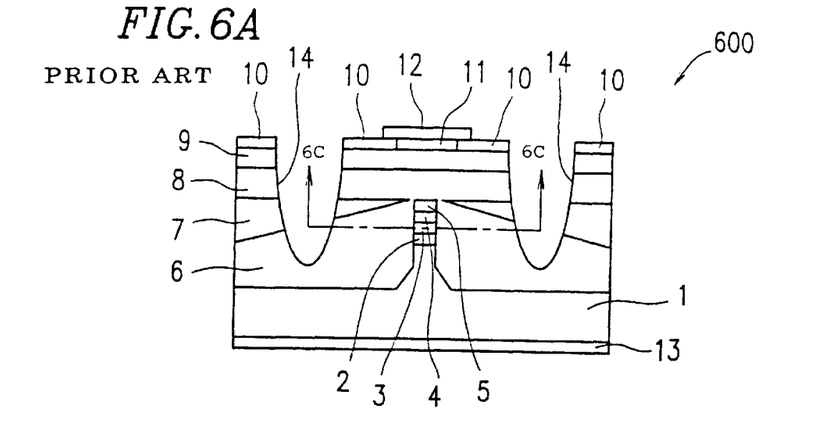
FIG. 6A is a cross-sectional view illustrating a front end face of a conventional semiconductor laser device.
Figure 6B:
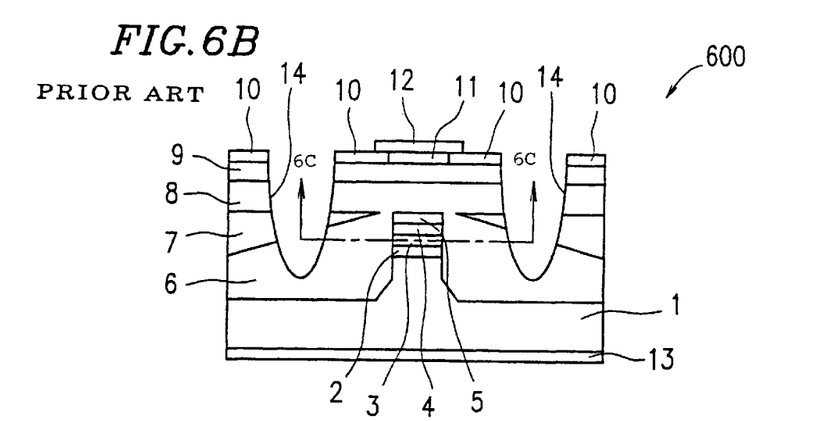
FIG. 6B is a cross-sectional view illustrating a rear end face of a conventional semiconductor laser device.

FIGS. 6A and 6B are diagrams illustrating a front and face and a rear end face of a conventional semiconductor laser device 600, respectively. FIG. 6C is a diagram illustrating a cross-sectional view of the semiconductor laser device 600, as taken along the 6C—6C line indicated in FIGS. 6A and 6B.

As shown in FIGS. 6A and 6B, the semiconductor laser device 600 includes: a semiconductor substrate 1 made of an n-type InP material and having a mesa structure; a light confinement layer 2, provided on a mesa region of the substrate 1, made of an n-type InGaAsP (composition wavelength: about 1.05 μm) and having a thickness of about 600 nm; an active layer 3 having a multiple quantum-well structure; a light confinement layer 4 made of a p-type InGaAsP material and having a thickness of about 600 nm; and a cladding layer 5 made of a p-type InP material and having a thickness of about 400 nm. The layers 2 through 5 are provided in this order on the semiconductor substrate 1. The active layer 3 includes seven InGaAsP well layers (not shown) each having a thickness of about 6 nm and a compressive distortion of 1.0% or less, and seven InGaAsP (composition wavelength: about 1.05 μm) barrier layers (not shown) each having a thickness of about 10 nm and no compressive distortion, which are alternately layered on one another.

The semiconductor laser device 600 also includes: a first buried layer 6 made of a p-type InP whose carrier density is $7.0 \times 10^{17}$ cm$^{-3}$, a second buried layer 7 made of an n-type InP whose carrier density is $2.0 \times 10^{18}$ cm$^{-1}$, a third buried layer 8 made of an p-type InP whose carrier density is $7.0 \times 10^{17}$ cm$^3$, and a contact layer 9 made of a p-type InGaAsP (composition wavelength: about 1.3 μm). The layers 6 through 9 are provided in this order in the vicinity of the active layer 3 so as to surround the mesa region of the substrate 1.

In order to reduce the parasitic capacity in the buried layers 6 through 8 so as to improve the frequency response characteristic of the semiconductor laser device 600, grooves 14 are provided by using an etching technique. The grooves 14 extend into the first buried layer 6 via the contact layer 9, the third buried layer 8, and the second buried layer 7.

On the contact layer 9, a SiO$_2$ film 10 is formed having a thickness of about 0.3 μm with an aperture therein. A metal multilayer film 11 including three layers (i.e., an Au layer, a Zn layer, and an Au layer) is formed in the aperture, and a p-type electrode 12 is formed on the metal multilayer film 11.

An n-type electrode 13 is provided on the back side of the semiconductor substrate 1.

Figure 6C:
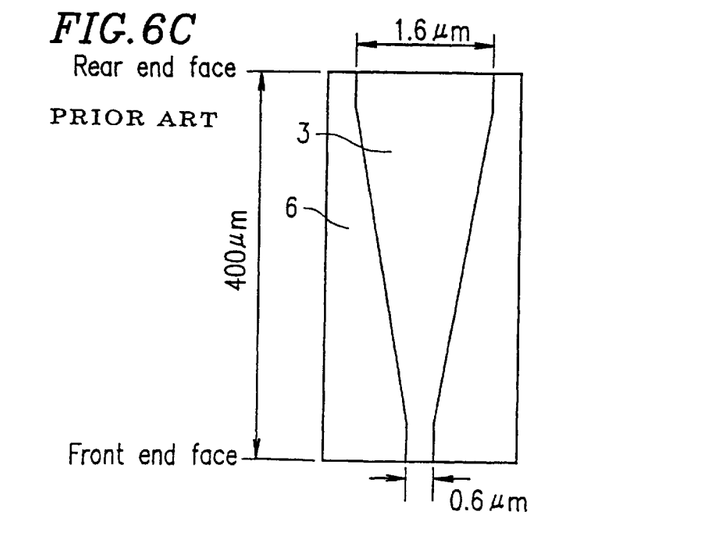
FIG. 6C is a diagram illustrating a top plan view of a cross section of a conventional semiconductor laser device, as taken along the 6C—6C line indicated in FIGS. 6A and 6B.

Referring to FIG. 6C, a cross-sectional view of the active layer 3 of the semiconductor laser device 600 is shown. The active layer 3 has a width of about 0.6 μm within about 25 μm from the front end face, while it has a width of about 1.6 μm within about 25 μm from the rear end face. The distance between the front end face and the rear end face is about 400 μm, and the cross section of the active layer 3 has a stripe structure. The width of the active layer 3 having this stripe structure continuously decreases from the rear end face toward the front end face. Thus, the stripe width of the active layer 3 at the front end face is narrower than that at the rear end face. This is a structure of a semiconductor laser device for implementing a narrow output angle characteristics and a low operation current characteristics at a high temperature (Y. Inaba et al., IEEE JSTQE, vol. 3, 1399–1404, 1997). With this structure, the effect of confining light within the active layer 3 continuously decreases from the rear end face toward the front end face. Therefore, a large amount of light leaks out of the active layer 3 into the first and third buried layers 6 and 8) in the area adjacent to the front end face.

Figure 7:
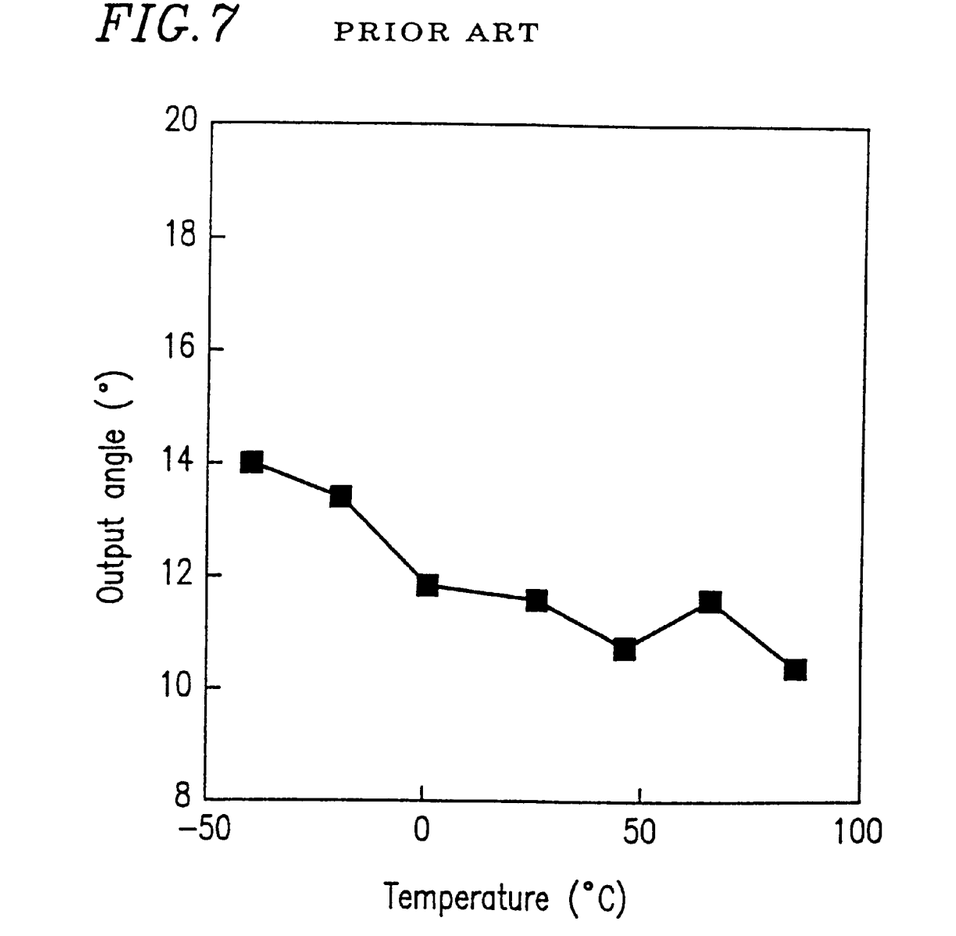
FIG. 7 is a graph illustrating a relationship between an operation environment temperature and an output angle of a conventional semiconductor laser device.
Figure 8:
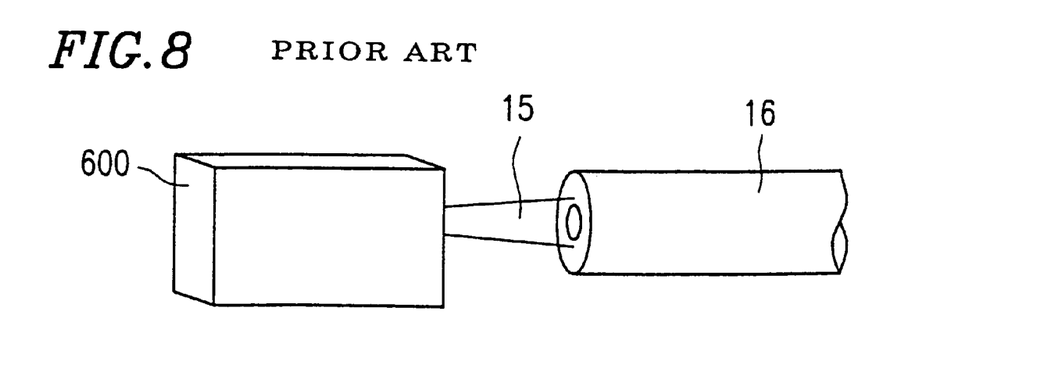
FIG. 8 is a schematic diagram illustrating an optical system for inputting a laser beam output from a conventional semiconductor laser device into an optical fiber.

FIG. 7 is a graph illustrating the relationship between an operation environment temperature and an output angle of the semiconductor laser device 600. As seen from FIG. 7, when the operation environment temperature changes from about −40° C. to about 85° C., the output angle changes from about 14.0° to about 10.2° (i.e., about 3.8°). Therefore, in a case where light output from the semiconductor laser device 600 is coupled to an optical fiber 16 as shown in FIG. 8, for example, such temperature conditions change the coupling efficiency between the light from the semiconductor laser device 600 and the optical fiber 16, thereby changing the intensity of the light propagated through the optical fiber 16. This will adversely affect the transmission characteristics of the optical fiber 16. The amount of change in the intensity of the light propagated through the optical fiber 16 should satisfy the practical standard in optical communications (i.e., 1 dB or less for a temperature change for about −40° C. to about 85° C.). Otherwise, the transmission characteristics of the optical fiber would be very poor. Thus, the semiconductor laser device 600 may not be usable without optical components for focusing light (e.g., a lens) between the semiconductor laser device 600 and the optical fiber 16.

The conventional semiconductor laser device 600, however, does not satisfy the above-mentioned standard, and the amount of change in the intensity of the light propagated through the optical fiber is 2 dB.

SUMMARY OF THE INVENTION

According to one aspect of the present invention, there is provided a semiconductor laser device, including: a semiconductor substrate of a first conductivity type; an active layer having a stripe structure formed on the semiconductor substrate; a first buried layer of a second conductivity type formed on the semiconductor substrate and in a vicinity of the active layer; a second buried layer of the first conductivity type formed on the first buried layer and in the vicinity of the active layer; and a third buried layer of the second conductivity type formed on the second buried layer and in the vicinity of the active layer.

In this semiconductor laser device, a difference between a refractive index of the first buried layer and a refractive index of the second buried layer is about 0.02 or less, and a difference between the refractive index of the second buried layer and a refractive index of the third buried layer is about 0.02 or less.

According to the present invention, the difference between the refractive index of the first buried layer and that of the second buried layer, and the difference between the refractive index of the second buried layer and that of the third buried layer are set to be small, thereby reducing the amount of light propagating through the active layer which leaks into the first buried layer or the third buried layer.

In one embodiment of the present invention, the semiconductor laser device further includes a pair of light confinement layers formed so as to sandwich the active layer.

In another embodiment of the present invention, a cross section of the active layer at a front end face is smaller than that of the active layer at a rear end face.

In still another embodiment of the present invention, the semiconductor laser device further includes an optical fiber provided adjacent to the front end face of the active layer into which light output from the front end face of the active layer is input.

In still another embodiment of the present invention, a carrier density of the first buried layer and that of the third buried layer are substantially equal to each other.

In still another embodiment of the present invention, the first conductivity type is n-type and the following inequality is satisfied:

$$\log_{10} f_n(x) < 1.05 \log_{10} x - 1.47,$$

where x represents a carrier density of the second buried layer, and $f_n(x)$ represents a carrier density of the first buried layer and the third buried layer.

In still another embodiment of the present invention, the first conductivity type is p-type and the following inequality is satisfied:

$$\log_{10} f_p(x) > 0.95 \log_{10} x + 1.40,$$

where x represents a carrier density of the second buried layer, and $f_p(x)$ represents a carrier density of the first buried layer and the third buried layer.

Thus, the invention described herein makes possible the advantages of providing a semiconductor laser device in which the output angle is less dependent on the temperature even with a small cross section of the active layer at the front end face.

These and other advantages of the present invention will become apparent to those skilled in the art upon reading and understanding the following detailed description with reference to the accompanying figures.

DESCRIPTION OF THE PREFERRED EMBODIMENTS

The inventors of the present invention have studied the factors in the variation of the output angle of the semiconductor laser device 600 according to the change in the operation temperature of the semiconductor laser device.

First, the threshold current and the slope efficiency vary according to the change in the operation temperature of the semiconductor laser device. More specifically, when the operation temperature of the semiconductor laser device is increased, the carrier density within the active layer varies due to its increased threshold current and reduced slope efficiency. This causes the refractive index of the active layer to vary. Conversely, when the operation temperature of the semiconductor laser device is decreased, the carrier density within the active layer varies due to its reduced threshold current and increased slope efficiency, thereby changing the refractive index of the active layer. These phenomena are referred to as a plasma effect.

Second, the wavelength of the output light from the semiconductor laser device varies according to the change in the operation temperature of the semiconductor laser device, thereby causing anomalous dispersion of the output light. This is because the refractive index of the active layer for the output light from the semiconductor laser device varies according to the wavelength of the output light. More specifically, when the operation temperature of the semiconductor laser device is increased, the wavelength of the semiconductor laser is shifted to a longer wavelength. Thus, the refractive index of the active layer for the output light varies, causing anomalous dispersion of the output light. Conversely, when the operation temperature of the semiconductor laser device is decreased, the wavelength of the semiconductor laser is shifted to a shorter wavelength. Thus, the refractive index of the active layer for the output light varies, causing anomalous dispersion of the output light.

These phenomena commonly occur when the light intensity distribution is concentrated (i.e., when the light is highly confined) in the active layer in a case where the output light is propagated through the semiconductor laser device along the direction of an optical cavity with a multiple reflection.

It has been found that when the width of the active layer of the semiconductor laser device is small (i.e., the light confinement within the active layer is relatively weak and the intensity distribution of the laser beam extends into the semiconductor buried layers), the change in the refractive index due to the temperature change of the semiconductor buried layers is also a factor related to the temperature dependency of the output angle, in addition to the above two factors.

The semiconductor buried layers are formed by alternately depositing an n-type and a p-type semiconductor layer. This is because the semiconductor buried layers should act as a current blocking layer. The light intensity distribution remarkably varies when the light is propagated through the semiconductor laser device along the optical cavity with a multiple reflection. As a result, the output angle of the semiconductor laser device remarkably varies according to the temperature change. The light intensity distribution remarkably varies because: 1) even if the same kind of semiconductor material is used, the refractive index is slightly changed depending on whether it is doped with an n-type or p-type material; and 2) the refractive index of n-type and p-type layers respond differently to the temperature change which occurs at the interface between the n-type and p-type layers.

A structure in which the width of the active layer is continuously decreased from the rear end face toward the front end face is greatly affected by the light intensity distribution due to the refractive index difference between the semiconductor buried layers. This causes the temperature dependency of the output angle to considerably increase, because the light confinement is high at the rear end face and low at the front end face.

With the above-described consideration, the inventors of the present invention have found the most significant factor in the variation of the output angle of the semiconductor laser device according to temperature conditions of the above conventional semiconductor laser device 600 is the remarkable difference between the refractive index of the first and third buried layers 6 and 8 and that of the second buried layer 7. With the structure of the above semiconductor laser device 600, the refractive index difference is about 0.025. This particularly causes a problem to the semiconductor laser device 600 which has a smaller cross section of the active layer 3 at the front end face (i.e., the width of the stripe is shorter than the wavelength of the output light), whereby a large amount of light leaks out of the active layer 3.

Referring to FIGS. 1A through 4, an example of the present invention will be described.

EXAMPLE 1

Figure 1A:
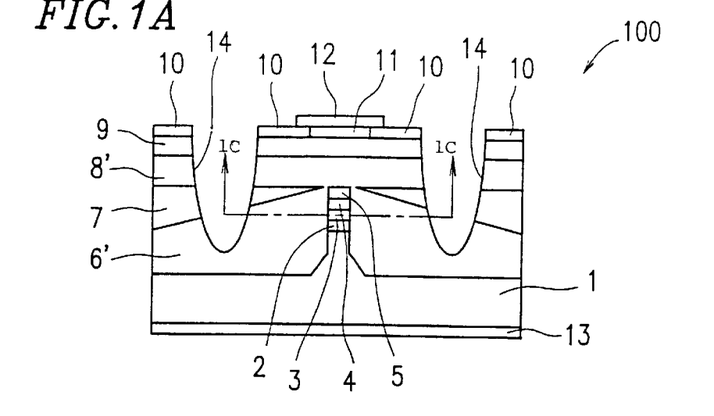
FIG. 1A is a cross-sectional view illustrating a front end face of a semiconductor laser device according to Example 1 of the present invention.
Figure 1B:
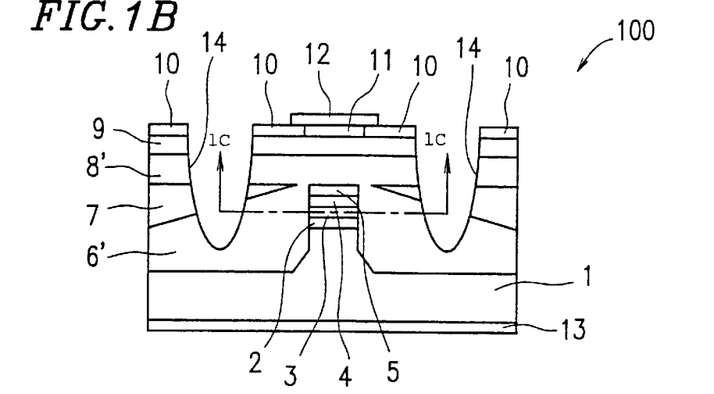
FIG. 1B is a cross-sectional view illustrating a rear end face of a semiconductor laser device according to Example 1 of the present invention.

As shown in FIGS. 1A and 1B, the semiconductor laser device 100 includes: a semiconductor substrate 1 made of an n-type InP material and having a mesa structure; a light confinement layer 2, provided on a mesa region of the substrate 1, made of an n-type InGaAsP (composition wavelength; about 1.05 $\mu$m) and having a thickness of about 600 nm; an active layer 3 having a multiple quantum-well structure; a light confinement layer 4 made of a p-type InGaAsP material and having a thickness of about 600 nm; and a cladding layer 5 made of a p-type InP material and having a thickness of about 400 nm. The layers 2 through 5 are provided in this order on the semiconductor substrate 1. The active layer 3 includes seven InGaAsP well layers (not shown) each having a thickness of about 6 nm and a compressive distortion of 1.0% or less, and seven InGaAsP (composition wavelength: about 1.05 $\mu$m) barrier layers (not shown) each having a thickness of about 10 nm and no compressive distortion, which are alternately layered on one another.

The semiconductor laser device 100 also includes: a first buried layer 6' made of a p-type InP whose carrier density is $3.0 \times 10^{17}$ cm$^{-3}$, a second buried layer 7 made of a n-type InP whose carrier density is $2.0 \times 10^{18}$ cm$^{-3}$, a third buried layer 8' made of an p-type InP whose carrier density is $3.0 \times 10^{17}$ cm$^{-3}$, and a contact layer 9 made of a p-type InGaAsP (composition wavelength: about 1.3 $\mu$m). The layers 6' through 9 are provided in this order in the vicinity of the active layer 3 so as to surround the mesa region of the substrate 1.

In order to reduce the parasitic capacity in the buried layers 6' through 8' so as to improve the frequency response characteristic of the semiconductor laser device 100, grooves 14 are provided by using an etching technique. The grooves 14 extend into the first buried layer 6' via the contact layer 9, the third buried layer 8', and the second buried layer 7.

On the contact layer 9, a SiO$_2$ film 10 is formed having a thickness of about 0.3 $\mu$m with an aperture therein. A metal multilayer film 11 including three layers (i.e., an Au layer, a Zn layer, and an Au layer) is formed in the aperture, and a p-type electrode 12 is formed on the metal multilayer film 11.

An n-type electrode 13 is provided on the back side of the semiconductor substrate 1.

Figure 1C:
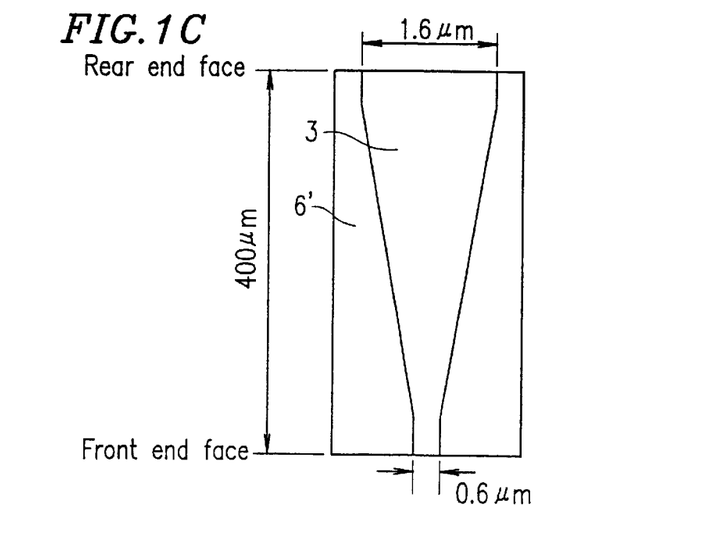
FIG. 1C is a diagram illustrating a top plan view of a cross section of a semiconductor laser device according to Example 1 of the present invention, as taken along the 1C—1C line indicated in FIGS. 1A and 1B.

Referring to FIG. 1C, a cross-sectional view of the active layer 3 of the semiconductor laser device 100 is shown. The active layer 3 has a width of about 0.6 $\mu$m within about 25 $\mu$m from the front end face, while it has a width of about 1.6 $\mu$m within about 25 $\mu$m from the rear end face. The distance between the front end face and the rear end face is about 400 $\mu$m, and the cross section of the active layer 3 has a stripe structure. The width of the active layer 3 having this stripe structure continuously decreases from the rear end face toward the front end face. Thus, the stripe width of the active layer 3 at the front end face is narrower than that at the rear end face.

Figure 2:
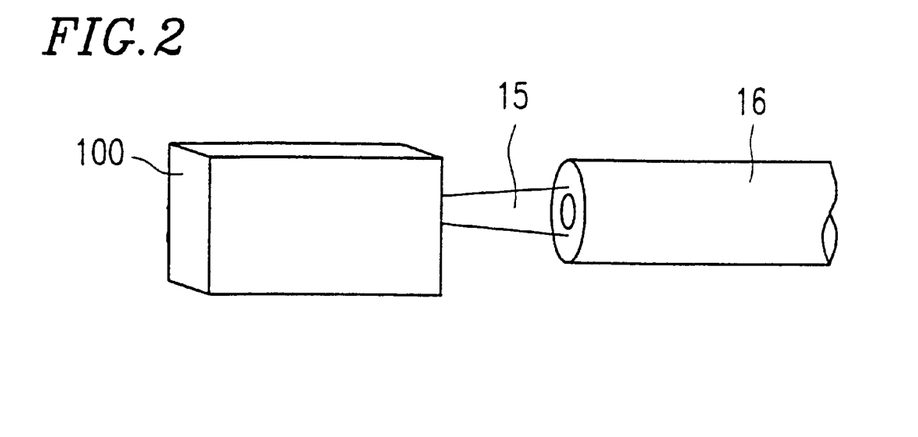
FIG. 2 is a schematic diagram illustrating an optical system for inputting a laser beam output from a semiconductor laser device into an optical fiber according to Example 1 of the present invention.

FIG. 2 is a schematic diagram illustrating an optical system for inputting a laser beam 15 output from the semiconductor laser device 100 into an optical fiber 16 according to this example of the present invention.

As shown in FIG. 2, a small output angle of the laser beam 15 is desirable in order to efficiently input the laser beam 15 into the optical fiber 16 without optical components for focusing light (e.g., a lens) between the semiconductor laser device 100 and the optical fiber 16.

Figure 3:
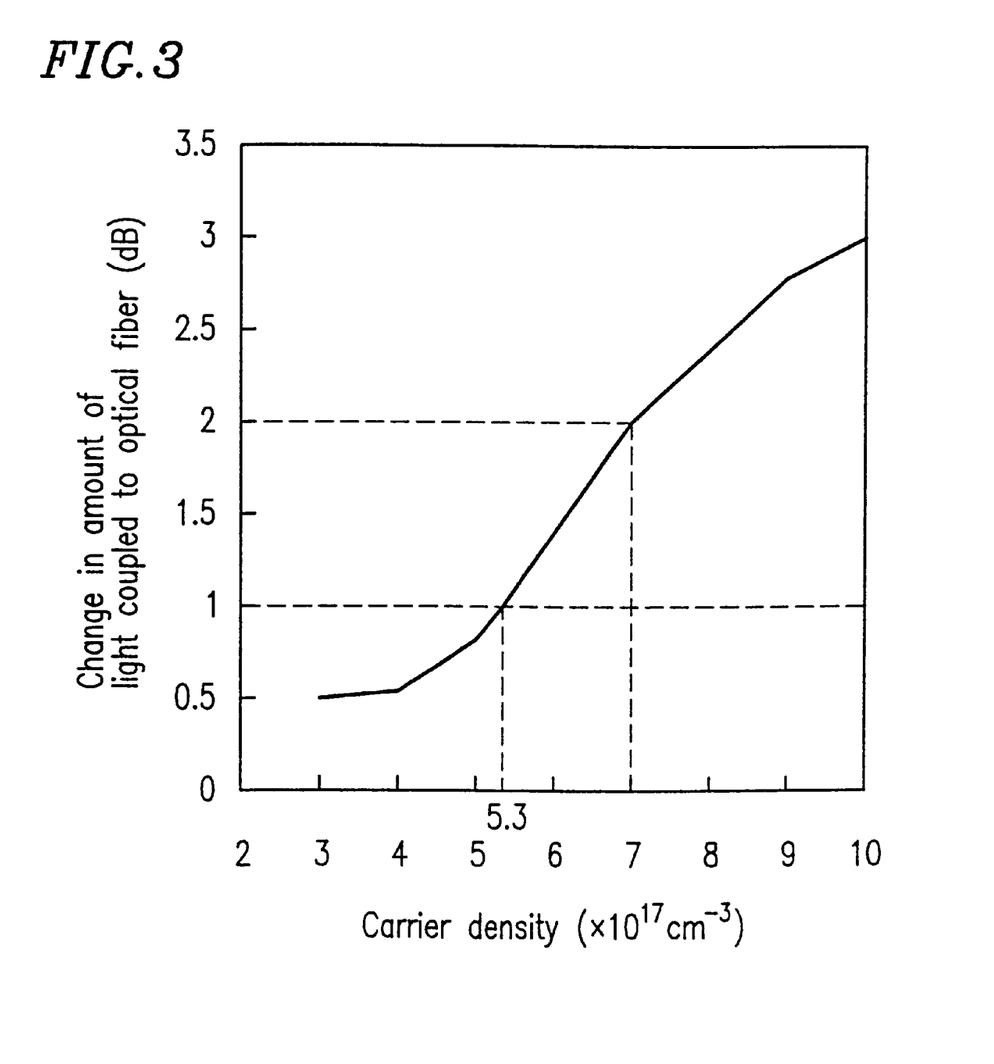
FIG. 3 is a graph illustrating a relationship between the carrier density of the first and third buried layers and the change in the amount of the light coupled to an optical fiber according to Example 1 of the present invention.

FIG. 3 is a graph illustrating a relationship between the carrier density of the first and third buried layers 6' and 8', and the change in the amount of the light optically coupled to the optical fiber 16 from the semiconductor laser device 100 in the range of the temperature of about −40° C. to about 85° C. In FIG. 3, the carrier density of the second buried layer 7 is set to be constant ($2.0 \times 10^{18}$ cm$^{-3}$) while the carrier density of the first and third buried layers 6' and 8' are set to be substantially equal to each other. As seen from FIG. 3, the change in the amount of the light coupled to the optical fiber 16 due to a temperature change is reduced as the carrier density of the first and third buried layers 6' and 8' decreases, thereby improving the optical coupling between the semiconductor laser device 100 and the optical fiber 16. When the carrier density of the first and third buried layers 6' and 8' is $5.3 \times 10^{17}$ cm$^{-3}$ or less, the change in the amount of the light coupled to the optical fiber 16 due to temperature change will satisfy the reference value (i.e., 1 dB or less). Thus, a semiconductor laser device having excellent transmission characteristics can be obtained.

The appropriate lower limit for the carrier density of the first and third buried layers 6' and 8' will be described. When the carrier density is below $3.0 \times 10^{17}$ cm$^{-3}$, the buried layers will have poor thyristor characteristics during an operation at a high temperature and a high output. Therefore, the semiconductor laser device cannot practically be used within this range.

The carrier density of the first and third buried layers 6' and 8' of the semiconductor laser device 100 according to this example of the present invention is $3.0 \times 10^{17}$ cm$^{-3}$ so that the change in the amount of the light coupled to the optical fiber 16 due to temperature change is suppressed to about 0.5 dB.

Figure 4:
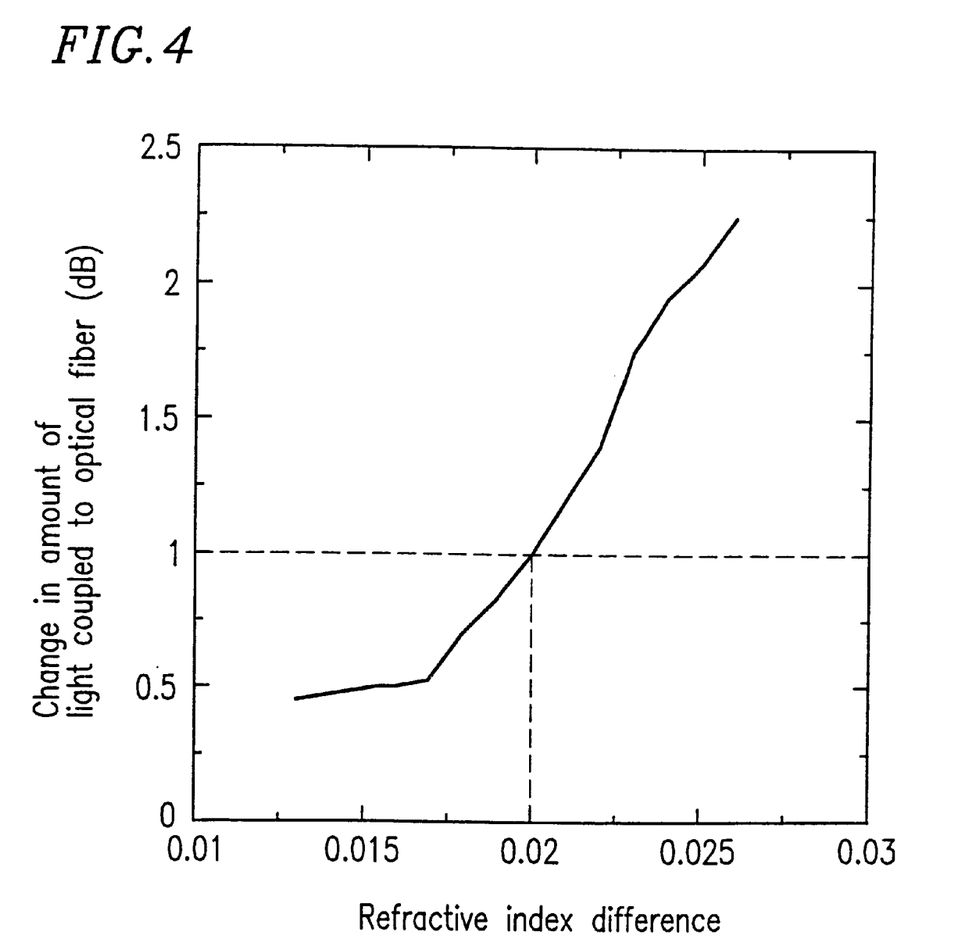
FIG. 4 is a graph illustrating a relationship of the difference between the refractive index of the first and third buried layers and that of the second buried layer, with respect to the change in the amount of the light coupled to an optical fiber according to Example 1 of the present invention.

FIG. 4 is a graph illustrating a relationship of the difference between the refractive index of the first and third buried layers 6' and 8' and that of the second buried layer 7, with respect to the change in the amount of the light optically coupled to the optical fiber 16 from the semiconductor laser device 100 in the temperature range of about −40° C. to about 85° C. Similarly to FIG. 3, the carrier density of the first and third buried layers 6' and 8' are set to be substantially equal to each other. As seen from FIG. 4, when the refractive index difference is about 0.02 or less, the reference value (1 dB or less) of the change in the amount of the light coupled to the optical fiber 16 is satisfied.

In the semiconductor laser device 100 according to this example of the present invention, the conductivity type of the semiconductor substrate 1 and that of the second buried layer 7 are both n-type, while that of the first and third buried layers 6' and 8' is p-type. Alternately, the conductivity type of the semiconductor substrate 1 and that of the second buried layer 7 may be n-type, while that of the first and third buried layers 6' and 8' may be p-type.

In a case where the semiconductor substrate 1 is n-type, and the following inequality is satisfied, the refractive index difference will be about 0.02 or less:

$$\log_{10} f_n(x) < 1.05 \log_{10} x - 1.47,$$

where x represents the carrier density of the second buried layer 7, and $f_n(x)$ represents the carrier density of the first and third buried layers 6' and 8'.

On the other hand, in a case where the semiconductor substrate 1 is p-type, and the following inequality is satisfied, the refractive index difference will be about 0.02 or less:

$$\log_{10} f_p(x) > 0.95 \log_{10} x + 1.40,$$

where x represents the carrier density of the second buried layer 7, and $f_p(x)$ represents the carrier density of the first and third buried layers 6' and 8'.

Figure 5:
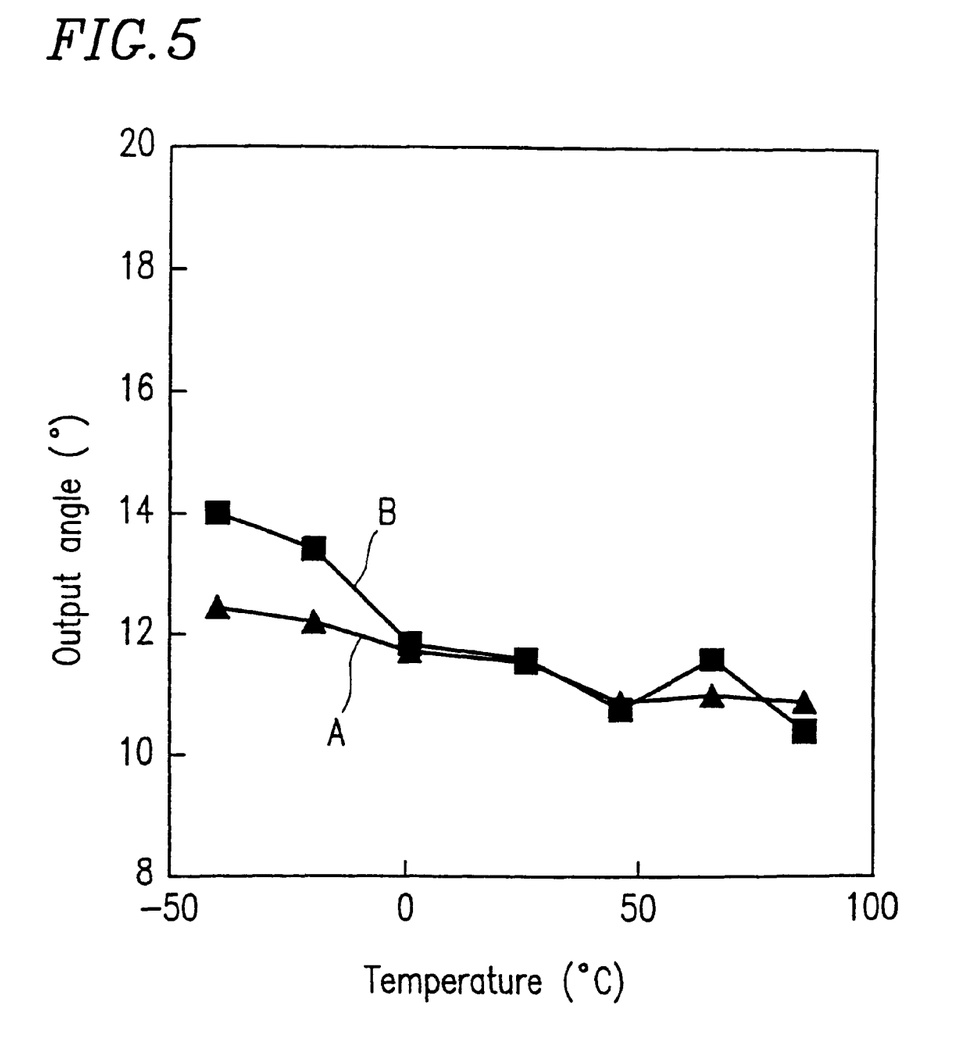
FIG. 5 is a graph illustrating a relationship between an operation environment temperature and an output angle of a semiconductor laser device according to Example 1 of the present invention.

FIG. 5 to a graph illustrating a relationship (line A) between the operation environment temperature and the output angle of the semiconductor laser device 100 according to this example of the present invention. For reference purposes, the graph also shows a relationship (line B) between the operation environment temperature and the output angle of the conventional semiconductor laser device 600 (shown in FIG. 7). As seen from line A, when the operation environment temperature of the semiconductor laser device 100 according to this example of the present invention is changed from about −40° C. to about 85° C., the output angle is changed from about 12.3° to about 10.8°, that is, the varied amount is suppressed to about 1.5°. In this case, the refractive index difference between the first and third buried layers 6' and 8' and the second buried layer 7 is reduced to about 0.017.

It can be seen from the above discussion that the semiconductor laser device 100 can be optically coupled to the optical fiber 16 with an excellent transmission characteristics by setting the refractive index difference between the first and second buried layers 6' and 7 and the refractive index difference between the second and third buried layers 7 and 8' to about 0.02 or less.

If a diffraction grating is provided by forming a plurality of grooves provided on the surface of the semiconductor substrate 1 in a direction perpendicular to the direction of the optical resonance, a refractive index coupled type distributed feedback (DFB) semiconductor laser can be obtained. A single wavelength operation of the semiconductor laser device can be realized by the wavelength-selectivity of the diffraction grating, thereby allowing for high-speed large-capacity communications.

When a similar diffraction grating is provided on the surface of the semiconductor substrate 1 with an optically absorbing material made of InAsP within the grooves of the diffraction grating, a gain coupled type distributed feedback (DFB) semiconductor laser can be obtained. Then, the influence of the reflectivity at the end face is reduced, thereby increasing the yield of a semiconductor laser device.

In the present example, the carrier density of the first and third buried layers 6' and 8' is substantially equal to each other, but the present invention is not limited to this, as long as the first and third buried layers 6' and 8' are of the same conductivity type.

As described above, in the semiconductor laser device of the present invention, the refractive index difference between the first and second buried layers 6' and 7, and the refractive index difference between the second and third buried layers 7 and 8' are about 0.02 or less. Thus, the temperature dependency of the output angle can be reduced, thereby improving the transmission characteristics of the optical coupling between the semiconductor laser device and an optical fiber.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor laser device, comprising:
   a semiconductor substrate of a first conductivity type;
   an active layer having a stripe structure formed on the semiconductor substrate;
   a first buried layer of a second conductivity type formed on the semiconductor substrate and in a vicinity of the active layer;
   a second buried layer of the first conductivity type formed on the first buried layer and in the vicinity of the active layer; and
   a third buried layer of the second conductivity type formed on the second buried layer and in the vicinity of the active layer;
   wherein:
   (a) the active layer is sandwiched within the buried layers; and
   (b) a difference between a refractive index of the first buried layer and a refractive index of the second buried layer is about 0.02 or less, and a difference between the refractive index of the second buried layer and a refractive index of the third buried layer is about 0.02 or less.

2. A semiconductor laser device according to claim 1, further comprising a pair of light confinement layers formed so as to sandwich the active layer.

3. A semiconductor laser device according to claim 1, wherein a cross section of the active layer at a front end face is smaller than a cross section of the active layer at a rear end face.

4. A semiconductor laser device according to claim 1, further comprising an optical fiber provided adjacent to the front end face of the active layer into which light output from the front end face of the active layer is input.

5. A semiconductor laser device according to claim 1, wherein a carrier density of the first buried layer and a carrier density of the third buried layer are substantially equal to each other.

6. A semiconductor laser device according to claim 5, wherein the first conductivity type is n-type and the following inequality is satisfied:

$$\log_{10} f_n(x) < 1.05 \log_{10} x - 1.47,$$

where x represents a carrier density of the second buried layer, and $f_n(x)$ represents a carrier density of the first buried layer and the third buried layer.

7. A semiconductor laser device according to claim 5, wherein the first conductivity type is p-type and the following inequality is satisfied:

$$\log_{10} f_p(x) > 0.95 \log_{10} x + 1.40,$$

where x represents a carrier density of the second buried layer, and $f_p(x)$ represents a carrier density of the first buried layer and the third buried layer.

* * * * *